United States Patent
Thyagarajan et al.

(10) Patent No.: US 10,928,569 B2
(45) Date of Patent: Feb. 23, 2021

(54) ANGLE-INSENSITIVE MULTI-WAVELENGTH OPTICAL FILTERS WITH HUE CONTROL

(71) Applicant: Palo Alto Research Center Incorporated, Palo Alto, CA (US)

(72) Inventors: Krishnan Thyagarajan, Mountain View, CA (US); José Ramón Martínez Saavedra, Madrid (ES)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/961,704

(22) Filed: Apr. 24, 2018

(65) Prior Publication Data

US 2019/0324179 A1 Oct. 24, 2019

(51) Int. Cl.
| | | |
|---|---|---|
| *G02B 5/08* | (2006.01) |
| *G02B 5/26* | (2006.01) |
| *G02B 5/28* | (2006.01) |
| *C23C 16/06* | (2006.01) |
| *G02B 1/00* | (2006.01) |
| *G02B 7/00* | (2021.01) |

(52) U.S. Cl.
CPC ............. *G02B 5/26* (2013.01); *C23C 16/06* (2013.01); *G02B 1/00* (2013.01); *G02B 5/0816* (2013.01); *G02B 5/28* (2013.01); *G02B 7/003* (2013.01)

(58) Field of Classification Search
CPC . G02B 5/26; G02B 1/00; G02B 7/003; G02B 5/0816; G02B 5/28; G02B 359/584; G02B 359/586; G02B 359/588; G02B 359/589; G02B 359/59; C23C 16/06
See application file for complete search history.

(56) References Cited

U.S. PATENT DOCUMENTS

| | | | | |
|---|---|---|---|---|
| 7,483,212 B2 * | 1/2009 | Cho | ........................ | G02B 1/113 359/582 |
| 7,859,648 B2 * | 12/2010 | Schwarzl | ............... | B82Y 10/00 204/192.27 |
| 9,958,583 B1 * | 5/2018 | Brown | ................... | G02B 5/206 |
| 2014/0256079 A1 * | 9/2014 | Shibayama | ............... | G01J 3/26 438/65 |
| 2017/0208292 A1 * | 7/2017 | Smits | ................... | H04N 13/243 |
| 2018/0259687 A1 * | 9/2018 | Kim | ..................... | G02B 5/0841 |

OTHER PUBLICATIONS https://en.wikipedia.org/wiki/Distributed_Bragg_reflector.*
https://en.wikipedia.org/wiki/Thin-film_interference.*

* cited by examiner

*Primary Examiner* — Bao-Luan Q Le
(74) *Attorney, Agent, or Firm* — Shun Yao; Park, Vaughan, Fleming & Dowler LLP (57) ABSTRACT

One embodiment can provide a laminate film for optical filtering. The laminate film can include a flexible substrate, one or more Bragg-reflector stacks positioned on the flexible substrate, and a high-refractive-index layer positioned on the one or more Bragg-reflector stacks. A respective Bragg-reflector stack has a number of layers with alternating refractive indices, and the Bragg-reflector is configured to have a stopping band with a predetermined center wavelength. A refractive index of the high-refractive-index layer is greater than that of an adjacent layer of the one or more Bragg-reflector stacks, thereby reducing incident-angle sensitivity of the one or more Bragg-reflector stacks. Moreover, at least one Bragg-reflector stack is configured to achieve a predetermined hue.

20 Claims, 11 Drawing Sheets

ANGLE-INSENSITIVE MULTI-WAVELENGTH OPTICAL FILTERS WITH HUE CONTROL

BACKGROUND

Field

This disclosure is generally related to optical filters. More specifically, this disclosure is related to low-cost, large-scale optical filters that are angle-insensitive and can provide hue control.

Related Art

The rapid development of high-power, low-cost semiconductor lasers has brought an unintentional consequence. More specifically, deliberate or accidental pointing of high-power laser pointers toward the sky is considered an aviation hazard. It can cause distraction or temporary flash blindness to a pilot, or even cause permanent harm to the pilot's eyes.

Although laws or regulations have been implemented to reduce the hazardous usage of laser pointers, they often cannot completely eliminate the risk. One possible solution is to require pilots to wear laser-safety goggles during mission-critical times, such as at landing or takeoff. However, wearing goggles can cause discomfort to pilots, and putting on and taking off goggles can be a cumbersome process.

SUMMARY

One embodiment can provide a laminate film for optical filtering. The laminate film can include a flexible substrate, one or more Bragg-reflector stacks positioned on the flexible substrate, and a high-refractive-index layer positioned on the one or more Bragg-reflector stacks. A respective Bragg-reflector stack has a number of layers with alternating refractive indices, and the Bragg-reflector is configured to have a stopping band with a predetermined center wavelength. A refractive index of the high-refractive-index layer is greater than that of an adjacent layer of the one or more Bragg-reflector stacks, thereby reducing incident-angle sensitivity of the one or more Bragg-reflector stacks.

In a variation on this embodiment, the flexible substrate comprises one or more of: polyethylene terephthalate (PET), polyethylene naphthalate (PEN), and polyether ether ketone (PEEK).

In a variation on this embodiment, the one or more Bragg-reflector stacks include alternating $TiO_2$ and $HfO_2$ layers.

In a variation on this embodiment, the refractive index of the high-refractive-index layer is graded.

In a variation on this embodiment, the high-refractive-index layer comprises one or more of: $ZrO_2$, indium tin oxide (ITO), and $Ta_2O_5$.

In a variation on this embodiment, a thickness of the high-refractive-index layer is between 1 and 200 nm.

In a variation on this embodiment, at least one Bragg-reflector stack is configured to achieve a predetermined hue.

In a further variation, a stopping band of the at least one Bragg-reflector stack is determined based on stopping bands of other Bragg-reflector stacks and the predetermined hue.

In a further variation, the one or more Bragg-reflector stacks include at least three Bragg-reflector stacks, and the Bragg-reflector stacks are configured such that the laminate film has a substantially neutral hue.

In a variation on this embodiment, the predetermined center wavelength of the stopping band is approximately 532 nm or 450 nm.

One embodiment can provide a method for fabricating a rollable optical filter. The method can include obtaining a flexible substrate; depositing, using a chemical vapor deposition (CVD) technique, one or more Bragg-reflector stacks on a surface of the flexible substrate; and depositing, using the CVD technique, a high-refractive-index layer on the one or more Bragg-reflector stacks. Depositing a respective Bragg-reflector stack comprises depositing a number of layers with alternating refractive indices, and the Bragg-reflector is configured to have a stopping band with a predetermined center wavelength. A refractive index of the high-refractive-index layer is greater than that of an adjacent layer of the one or more Bragg-reflector stacks, thereby reducing incident-angle sensitivity of the one or more Bragg-reflector stacks.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

The embodiments described herein solve the technical problem of providing optical filtering for a number of applications, including aviation applications. More specifically, a novel optical filter that is angle-insensitive and has a desired color appearance (or hue) can be applied onto the cockpit window to block hazardous laser light without interfering with normal pilot operations. The novel optical filter can include a number of Bragg reflectors for filtering specific wavelengths and a high-refractive-index layer for reducing the angle dependence of the Bragg reflectors. The high-refractive-index layer can be deposited on top of the Bragg reflectors, facing incident light. In some embodiments, this novel optical filter can effectively block light having an incident angle varying from 0° to 75°. To achieve a desired color appearance or hue effect, the passing/stopping bands of the Bragg reflectors can be carefully designed.

Novel Optical Filter

Figure 1:
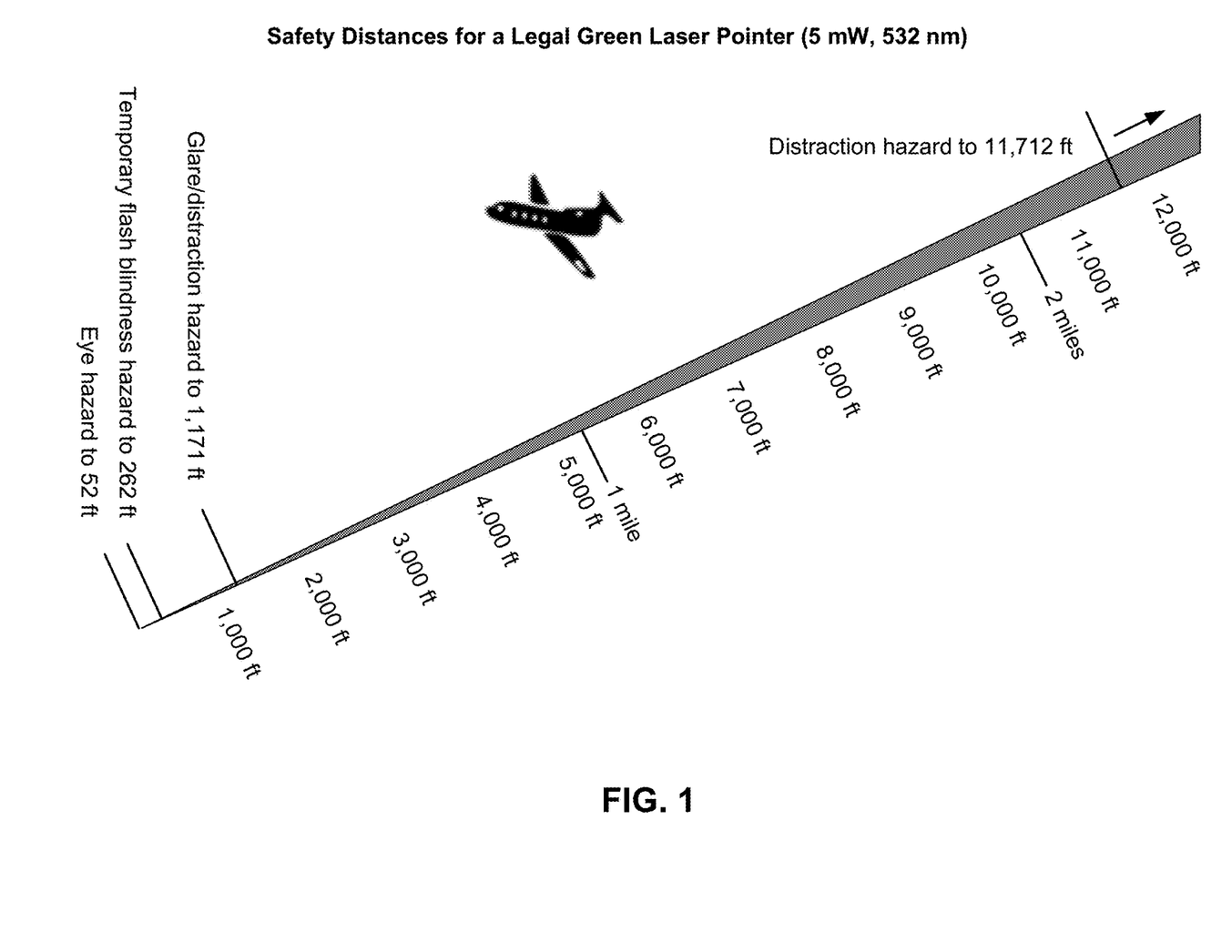
FIG. 1 shows the safety distance for a legal green laser pointer.

As discussed before, laser light can present a hazardous condition for aircraft pilots, especially during mission-critical phases, such as takeoff and landing. FIG. 1 shows the safety distance for a legal green laser pointer. As one can see from FIG. 1, at a close range (e.g., 52 feet or below), a legally purchased 5 mW green (e.g., having a wavelength of 532 nm) laser pointer can cause permanent eye damage. As the distance between the aircraft and the laser pointer increases, the level of hazard decreases. For example, if the distance is between 52 feet and 262 feet, the light may cause temporary flash blindness to the pilot. The glare hazard can exist for up to 1,171 feet. As one can see from the drawing, areas of most concern (e.g., eye damage, flash blindness and glare) occur relatively close to the aircraft. On the other hand, the risk of distraction hazard can cover a long distance, over two miles. For higher power lasers, the safety distance can be much further. For example, a 6-watt green laser can cause flash blindness to about 1.5 miles, and cause glare to about 7 miles. Schemes for reducing laser pointer hazards are important in ensuring aviation safety.

Requiring pilots to wear goggles can be cumbersome, and existing laser-safety goggles are not designed for aviation applications. One possible approach can include tinting the cockpit window to block strong light. However, the amount of tint required for effective attenuation of the laser light may interfere with the vision of the pilot.

Several other approaches have been proposed, including depositing a transparent polymer film on the cockpit window to function as optical filters. The optical filters can be based on nanoparticles or holographic exposure of a photosensitive polymer film. Such approaches can be impractical for aviation applications due to implementation complexity and high cost. For example, embedding a polymer (e.g., a photosensitive polymer) into the window can be an expensive procedure, and glass expansion/contraction through temperature cycles may affect polymer and hence filter capability. Moreover, these existing approaches did not take into consideration angle dependency of the filters and will also provide an additional unwanted hue to the transmitted light, making important external cues, such as landing runway lights, difficult to discern.

Considering that commercially available laser pointers often have well-defined wavelengths (e.g., 532 nm for green lasers and 450 nm for blue lasers), optical filters with a narrow stopping band can be considered good candidates for blocking these laser lights. However, most commercially available optical filters are small in scale and highly sensitive to incidence angle. For example, Bragg reflectors have been shown to be very effective in blocking unwanted wavelengths. However, by virtue of their design, optical filters based on Bragg reflectors can be highly angle-sensitive, meaning that their filtering capacity can be dependent on the angle of incidence of light. When the incidence angle changes (e.g., from normal to obtuse), the filter may no longer be able to block the particular wavelength.

Figure 2A:
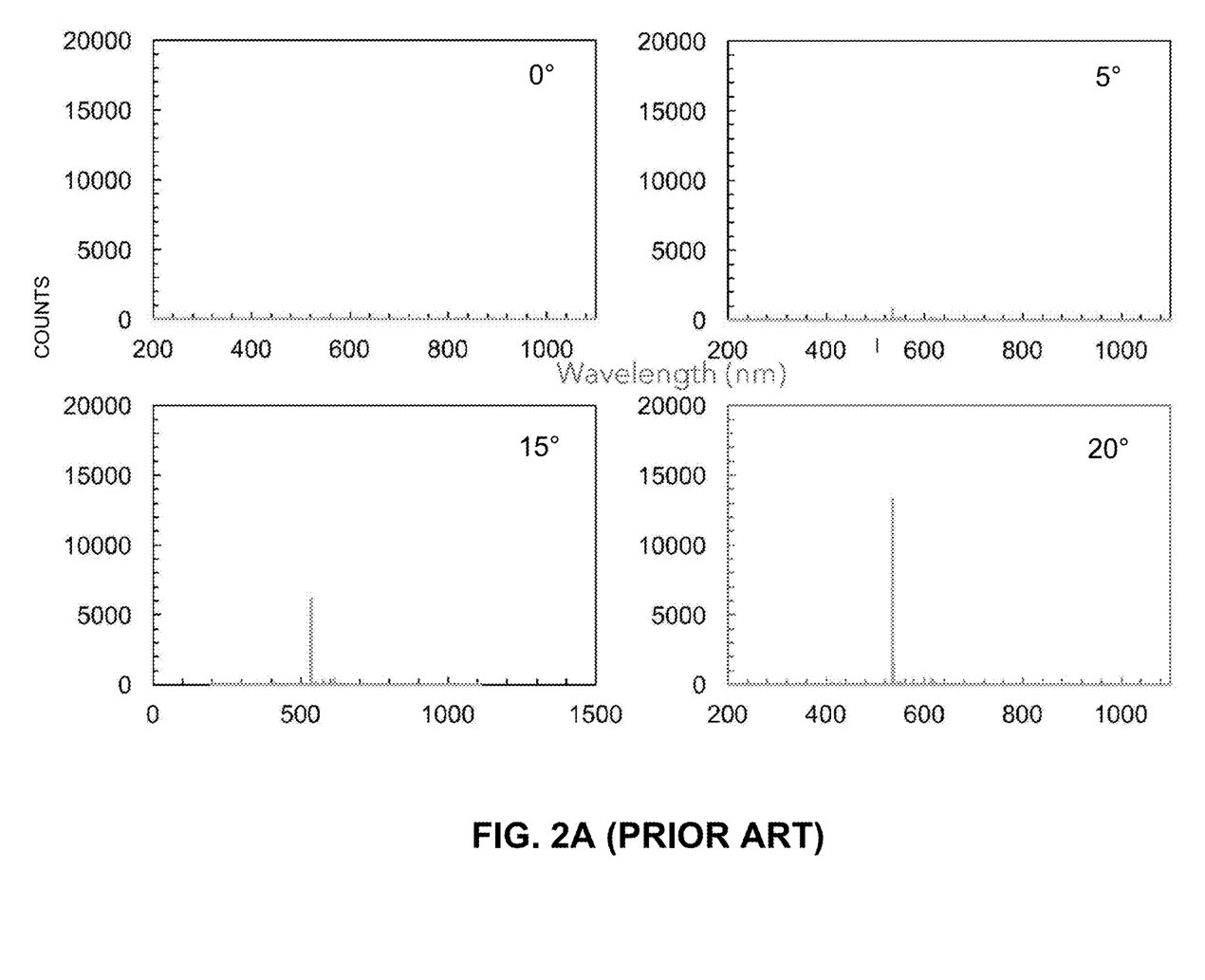
FIG. 2A illustrates the angle dependence of a conventional single-wavelength filter (prior art).
Figure 2B:
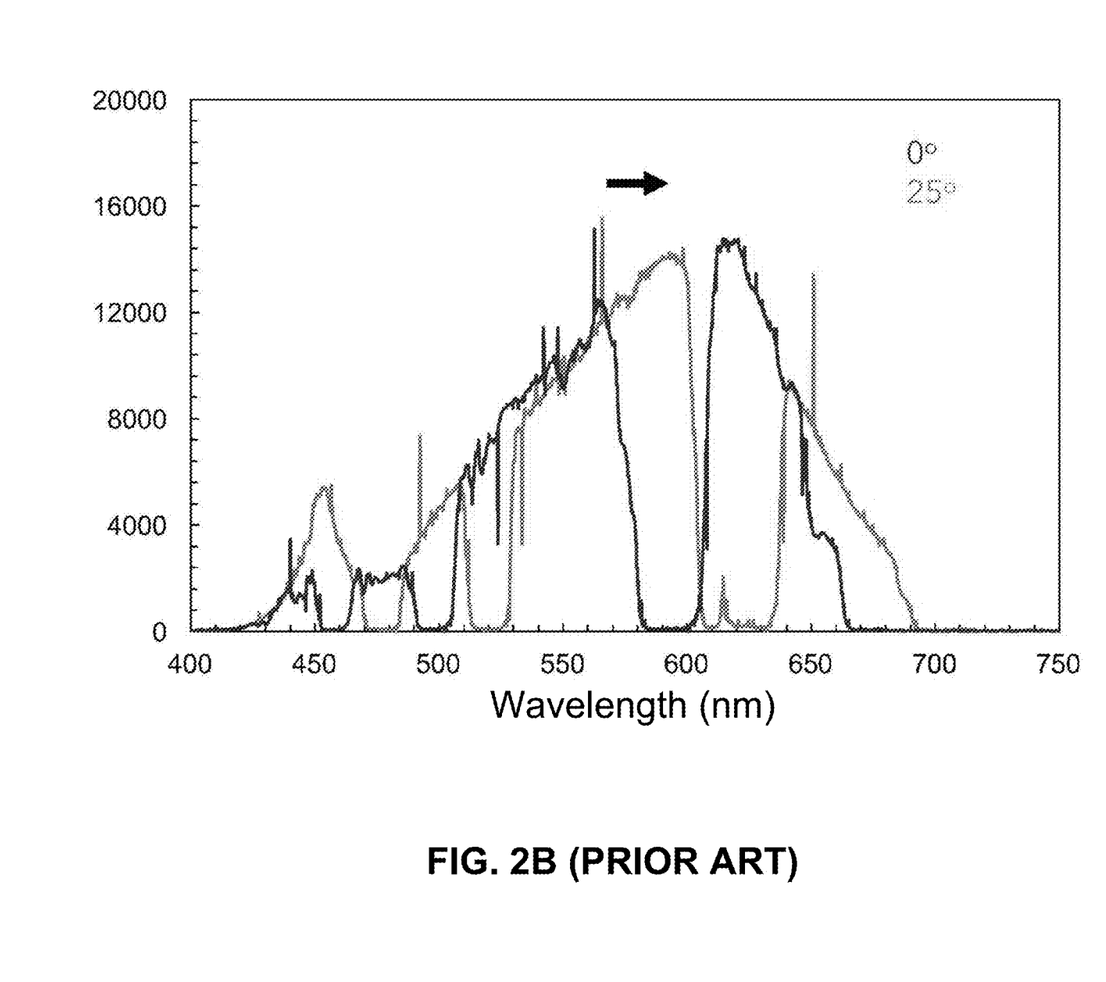
FIG. 2B illustrates the angle dependence of a conventional multi-wavelength filter (prior art).

FIG. 2A illustrates the angle dependence of a conventional single-wavelength filter (prior art). In the example shown in FIG. 2A, the filter is designed to block light with a wavelength of 532 nm. As one can see from FIG. 2A, as the incidence angle increases from 0° to 20°, the filter becomes less effective. The angle dependence of a multi-wavelength filter can be more severe. FIG. 2B illustrates the angle dependence of a conventional multi-wavelength filter (prior art). As one can see from FIG. 2B, as the light incidence angle changes from 0° to 25°, the stopping/passing bands of the filter may have flipped, i.e., previous passing bands become stopping bands, and vice versa. Clearly, these types of optical filters are not suitable for aviation usages where the hazardous light may shine at any angle.

Figure 3:
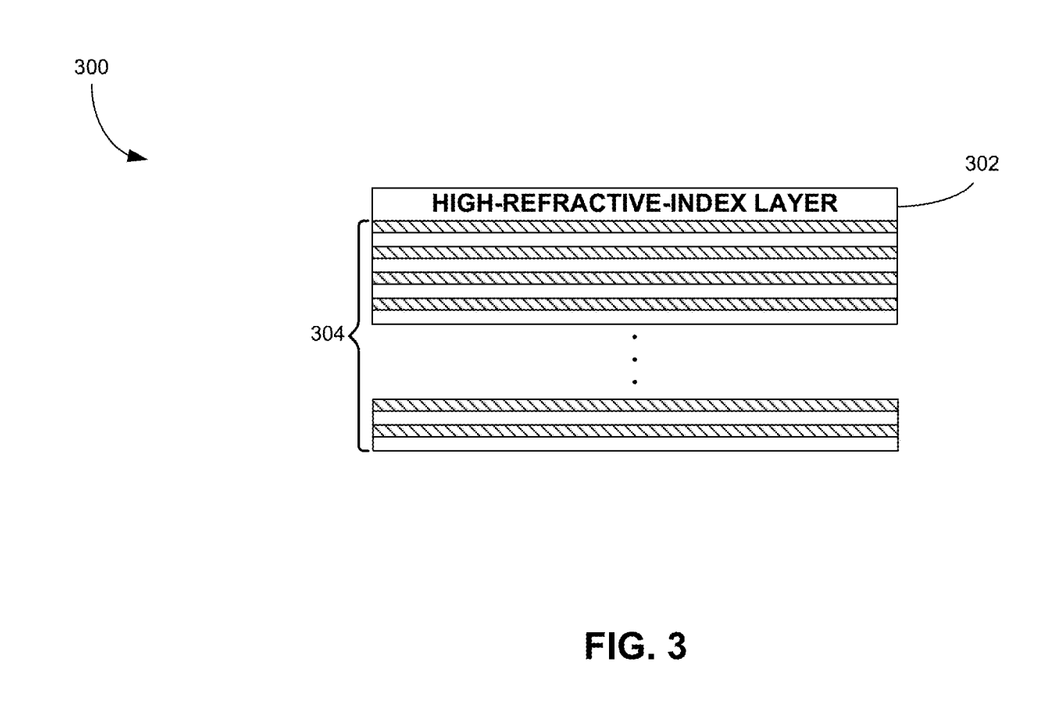
FIG. 3 shows an exemplary angle-insensitive optical filter, according to one embodiment.

To overcome this problem, in some embodiments, a high-refractive-index layer can be used to reduce the angle dependence of Bragg reflectors. FIG. 3 shows an exemplary angle-insensitive optical filter according to one embodiment. Angle-insensitive optical filter 300 can include a high-refractive-index layer 302 and a Bragg-reflector stack 304. High-refractive-index layer 302 can be made of materials with a high refractive index (e.g., refractive index of 2.0 or higher). Examples of materials with a high refractive index can include, but are not limited to: certain dielectric materials (e.g., zirconia), certain conductive oxides (e.g., indium tin oxide (ITO)), etc. In further embodiments, the refractive index of high-refractive-index layer 302 can be larger than at least one of the Bragg layers in Bragg-reflector stack 304. To achieve better angle-insensitivity, it may be desirable to position the high-refractive-index layer immediately adjacent to the Bragg layer that has a lower refractive index. In the example shown in FIG. 3, the refractive index of high-refractive-index layer 302 may be between the refractive indices of high- and low-index layers of Bragg-reflector stack 304, and one may consider positioning high-refractive-index layer 302 immediately adjacent to the low-index layer of Bragg-reflector stack 304.

In some embodiments, high-refractive-index layer 302 can include a single layer of material having a constant refractive index. For example, high-refractive-index layer 302 can include a layer of zirconia having a constant refractive index of 2.17 (at the wavelength of 532 nm) throughout its thickness. The thickness of high-refractive-index layer 302 can be between a few nanometers and a few hundred nanometers (e.g., between 1 nm and 200 nm).

In some embodiments, high-refractive-index layer 302 can include a plurality of layers having discontinuous but gradually changing refractive indices. Alternatively, high-refractive-index layer 302 can include a single layer of material having a continuously changing refractive index. For example, an ITO layer with a graded doping level can have a continuously changing refractive index.

Bragg-reflector stack 304 can include a number of Bragg reflectors. A Bragg reflector is also called a Bragg mirror. In its simplest form, a Bragg reflector can be a quarter-wave stack of dielectric materials. The quarter-wave stack can include a stack of layers, where the material from which the layers are made alternates from layer to layer down the stack. The materials are selected in such a way that the refractive indices of the layers alternate between high and low. The thicknesses of the layers are chosen such that the path length difference for reflections from different high-index layers are integer multiples of the wavelength for which the reflector is designed to reflect, resulting in these reflections being in phase. The reflections from the low-index layers have exactly half a wavelength in path length difference. Because there is a 180° difference in phase shift at a low-to-high index boundary, compared to a high-to-low boundary, these reflections are also in phase. For normal incidence angle, the layers have a thickness of a quarter of the designed wavelength.

In some embodiments, Bragg-reflector stack 304 can include multiple Bragg reflectors, each designed for a particular wavelength. For example, Bragg-reflector stack 304 can include two back-to-back Bragg reflectors, one designed for blocking green light (e.g., with a wavelength of 532 nm) and one designed for blocking blue light (e.g., with a wavelength of 450 nm). As a result, Bragg-reflector stack 304 can effectively block both wavelengths.

Figure 4A:
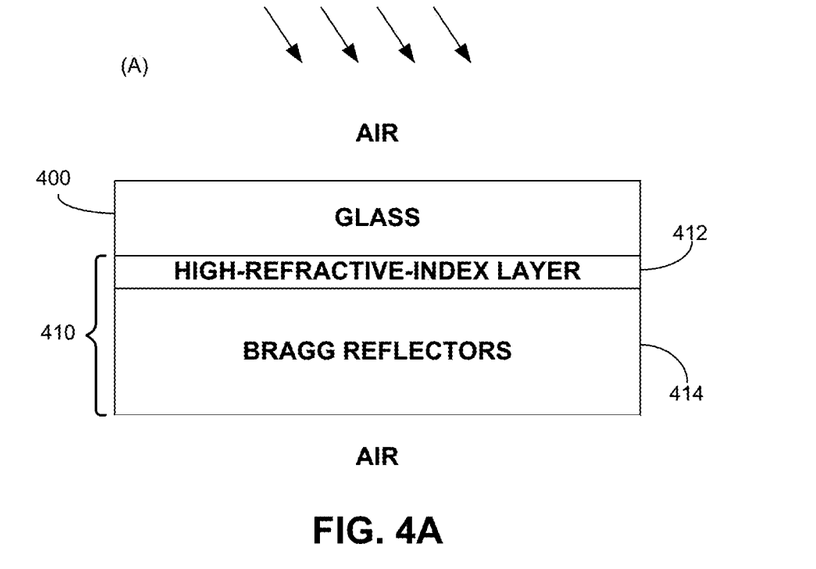
FIG. 4A shows an exemplary implementation of an angle-insensitive optical filter, according to one embodiment.

FIG. 4A shows an exemplary implementation of an angle-insensitive optical filter, according to one embodiment. In FIG. 4A, angle-insensitive optical filter 410 is applied onto a glass superstrate 400, and light enters angle-insensitive optical filter 410 from the side of glass superstrate 400, as indicated by the arrows. This configuration can be similar to the situation where the novel optical filter is applied onto the inside surface of the cockpit window. In the example shown in FIG. 4A, the bottom layer of Bragg-reflector stack 414 is exposed to air. In practice, another transparent layer (e.g., a lamination film) may be deposited on the bottom Bragg layer.

Figure 4B:
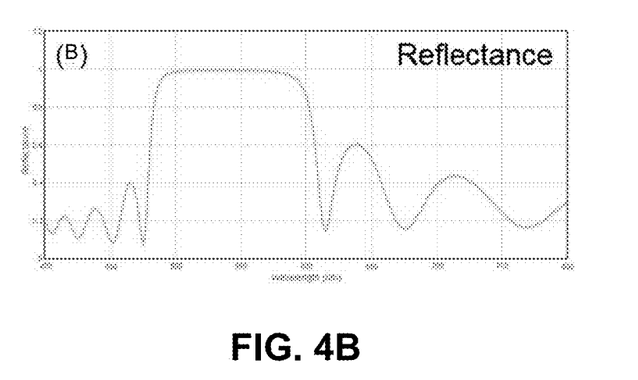
FIG. 4B shows the reflectance spectrum of the filter structure shown in FIG. 4A, according to one embodiment.
Figure 4C:
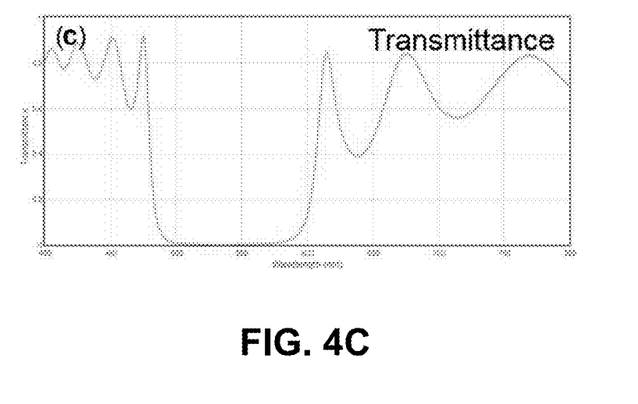
FIG. 4C shows the transmittance spectrum of the filter structure shown in FIG. 4A, according to one embodiment.

Optical filter 410 can include a high-refractive-index layer 412 and a Bragg-reflector stack 414. In some embodiments, the refractive index of high-refractive-index layer 412 can be at least 2. In some embodiments, high-refractive-index layer 412 can include zirconia ($ZrO_2$) or tantalum pentoxide ($Ta_2O_5$), and Bragg-reflector stack 414 can include alternating hafnia ($HfO_2$) and rutile ($TiO_2$) layers. In one embodiment, Bragg-reflector stack 414 can include 20 layers, and the thickness of each layer can be designed in such a way that Bragg-reflector stack 414 can block light with a wavelength of 532 nm. FIG. 4B shows the reflectance spectrum of the filter structure shown in FIG. 4A, according to one embodiment. FIG. 4C shows the transmittance spectrum of the filter structure shown in FIG. 4A, according to one embodiment. From FIGS. 4B and 4C, one can see a clear blocking band around the 532 nm wavelength. Note that the FWHM (full width at half maximum) of the optical filter shown in FIGS. 4A-4C is around 100 nm. In practice, one can obtain an optical filter with a narrower FWHM by increasing the number of layers.

A transfer-matrix method can be used to determine the transmittance or reflectance of a multi-layer stack. For example, Fresnel's law can be used to determine the amount of reflected or transmitted light across any interface between two dissimilar media. More specifically, the reflectance of a Bragg-reflector stack can be calculated as:

$$R = \left(\frac{1-A}{1+A}\right)^2,$$

where $$A = \left(\frac{n_H}{n_L}\right)^{2N}\left[\frac{n_H^2}{n_s}\right].$$

In this equation, $n_H$ and $n_L$ are the refractive indices for the high-index layer and the low-index layer, respectively, in a Bragg-reflector pair; N is the number of Bragg-reflector pairs in the stack, and $n_s$ is the refractive index of the substrate. For an angle-insensitive optical filter having an additional high-refractive-index layer deposited on top of the Bragg-reflector stack, the reflectance or transmittance of the entire structure can be computed by incorporating the matrix associated with the high-refractive-index layer. The matrix can represent the reflection or transmission as well as propagation of light through the high-refractive-index layer. This novel angle-insensitive optical filter can also be referred to as a sandwiched Bragg stack (SBS).

Figure 5A:
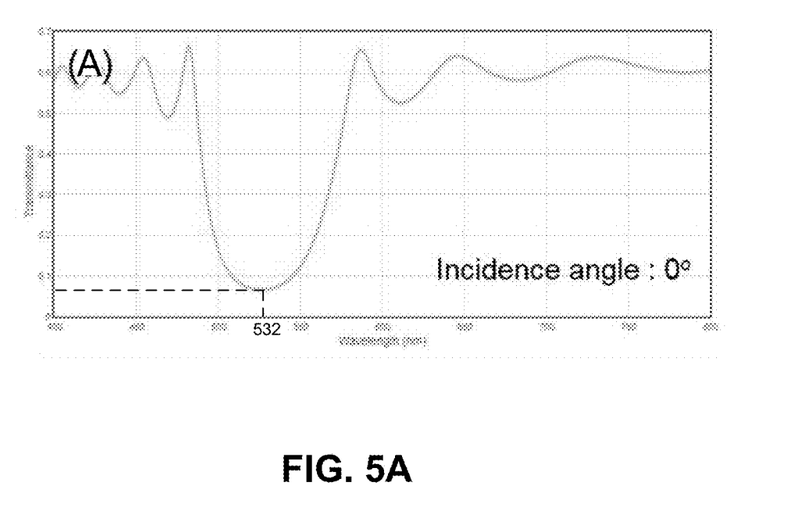
FIG. 5A shows the calculated transmittance of a sandwiched Bragg stack at an incidence angle of 0°, according to one embodiment.
Figure 5B:
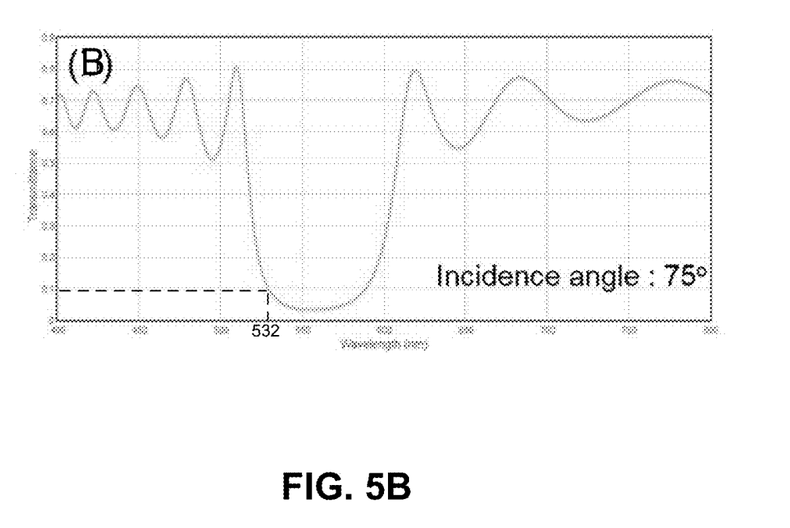
FIG. 5B shows the calculated transmittance of a sandwiched Bragg stack at an incidence angle of 75°, according to one embodiment.

FIG. 5A shows the calculated transmittance of a sandwiched Bragg stack at an incidence angle of 0°, according to one embodiment. FIG. 5B shows the calculated transmittance of a sandwiched Bragg stack at an incidence angle of 75°, according to one embodiment. As one can see from FIGS. 5A and 5B, for the designed wavelength (i.e., 532 nm), the transmittance of the SBS changes from 8.4% to 9.3% when the incidence angle changes from 0° to 75°. Such a small difference can be tolerated. In other words, the novel SBS-based optical filter can be insensitive to change in incidence angles of up to 75°. Having an angle-insensitivity over such a wide range of incidence angles makes the SBS-based optical filter a good candidate for aviation applications.

Figure 6:
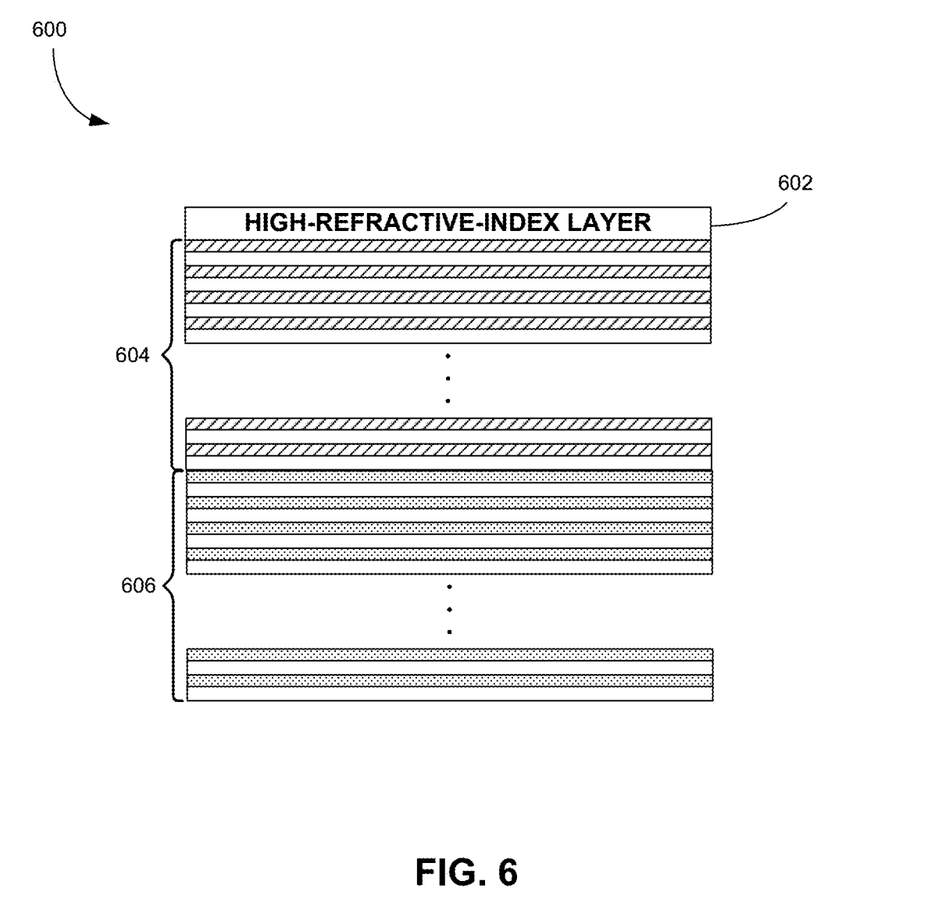
FIG. 6 shows an exemplary dual-wavelength sandwiched Bragg stack, according to one embodiment.

In the examples shown in FIGS. 4A-5B, the optical filter has one stopping band. In practice, it is possible to design an SBS-based optical filter that has more than one stopping band. For example, by including multiple Bragg-reflector stacks designed for different wavelengths, the SBS-based optical filter can have multiple stop bands. FIG. 6 shows an exemplary dual-wavelength sandwiched Bragg stack, according to one embodiment. SBS 600 can include a high-refractive-index layer 602 and Bragg-reflector stacks 604 and 606. In this example, Bragg-reflector stacks 604 and 606 are stacked together, and high-refractive-index layer 602 is situated on Bragg-reflector stack 604.

In some embodiments, one of the Bragg-reflector stacks (e.g., stack 604) can be designed to have a particular Bragg wavelength (e.g., 532 nm), and the other Bragg-reflector stack (e.g., stack 606) can be designed to have a different Bragg wavelength (e.g., 450 nm). As a result, SBS 600 can have dual stopping bands. Each Bragg-reflector stack can consist of materials selected based on the designed Bragg wavelength (i.e., the center wavelength of the stopping band). The thickness of each layer can also be carefully selected based on the Bragg wavelength. In some embodiments, both stacks can include alternating layers of $TiO_2$ and $HfO_2$ but with different thicknesses in order to achieve different Bragg wavelengths. Other materials can also be possible. For example, one Bragg-reflector stack can include a particular kind of material composition (e.g., $TiO_2/HfO_2$), whereas the other Bragg-reflector stack can include a different kind of material composition (e.g., $TiO_2/SiO_2$). The scope of this disclosure is not limited to the detailed composition of the Bragg-reflector stacks.

Sandwiched Bragg Stack with Hue Control

Figure 7:
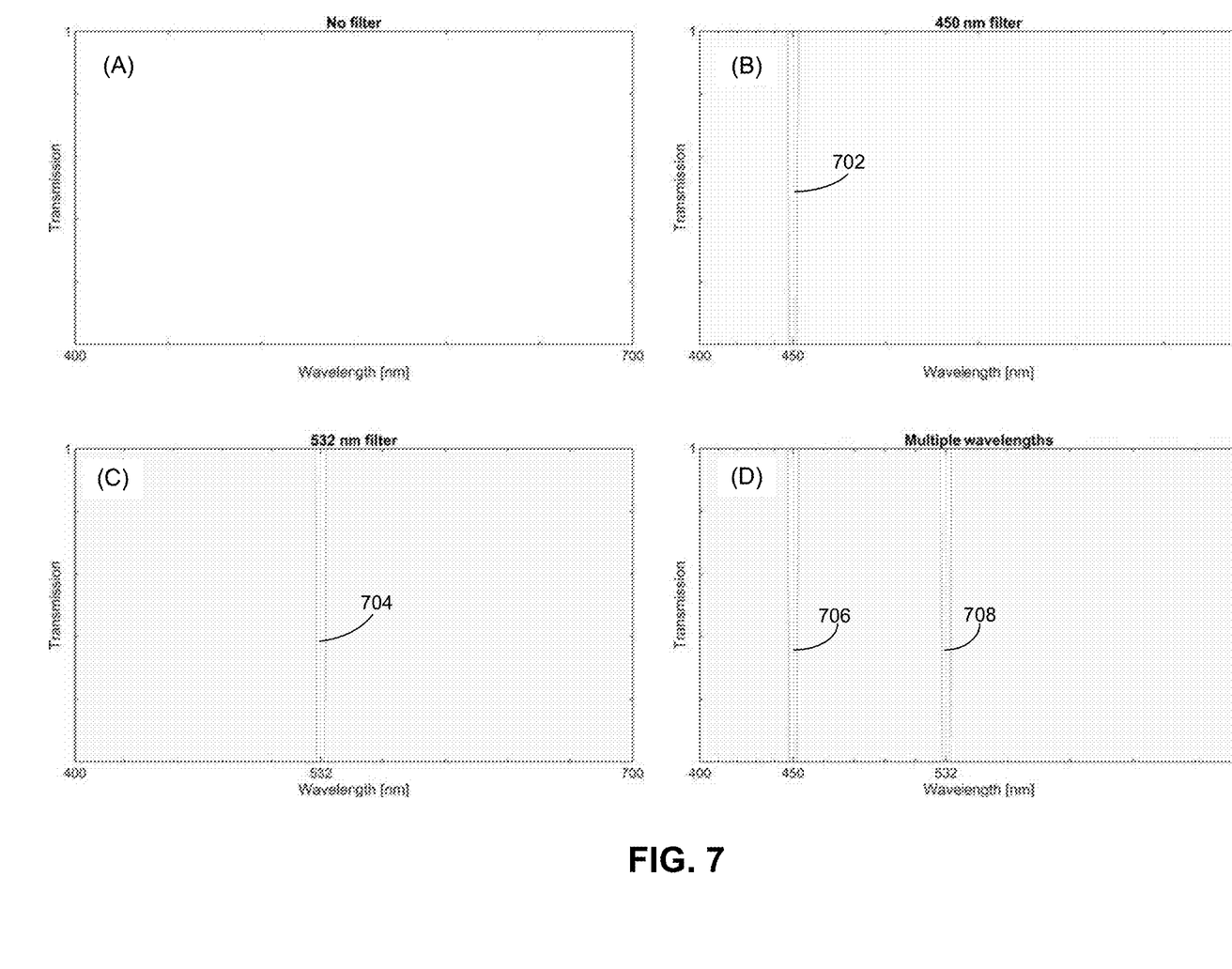
FIG. 7 shows the hues perceived by human eyes for different scenarios where a certain wavelength or a combination of wavelengths is filtered out.

An optical filter by nature can have a certain color appearance, also referred to as a hue. For example, a filter that blocks the blue light (e.g., light with 450 nm wavelength) may appear reddish to the naked eye, whereas a filter that blocks the green light (e.g., light with 532 nm wavelength) may appear pinkish to the naked eye. FIG. 7 shows the hues perceived by human eyes for different scenarios where a certain wavelength or a combination of wavelengths is filtered out. More specifically, FIG. 7A shows the scenario where no wavelength is filtered. The background shows the perceived color, which is white or no color in FIG. 7A. FIG. 7B shows the scenario where the 450 nm wavelength (as indicated by stopping band 702) is filtered out. The background of FIG. 7B shows the perceived color as yellowish. FIG. 7C shows the scenario where the 532 nm wavelength (as indicated by stopping band 704) is filtered. The background of FIG. 7C shows the perceived color as pinkish. FIG. 7D shows the scenario where both the 450 nm and 532 nm wavelengths (as indicated by stopping bands 706 and 708, respectively) are filtered out. The background of FIG. 7D shows the perceived color as somewhat orange.

Note that the perception of color to the human eye is catalogued into what is known as the CIE 1931 color space. Each point in the space has a color coordinate that can accurately describe a hue. A combination of intensities of the primary colors—red, green and blue—determines the effective color observed. In certain applications, it is very important to control the perceived color either in reflection or transmission of the light. For example, it is important to make sure that the colors seen through an aircraft cockpit window are well-controlled so that the pilot can have a clear view of his surroundings. It can also be important to control the colors perceived through a glass screen covering an electronic display such that the viewer can have a clear view of the display. Another example can include aesthetic use of glass in consumer displays.

As shown in FIG. 7, when a certain color or combination of colors is removed from the transmitted light, the transmitted light can have a distinct hue. In other words, if one were to look through an optical filter which effectively filters out a few pre-determined wavelengths, one will see colored instead of white light. This can be problematic in such a filter if the filter is applied to the cockpit window of an aircraft, because it can distort the color perception of the pilot. It is desirable to provide an angle-insensitive optical filter that does not significantly distort the color perception of the pilot. In an ideal case, an optical filter should be able to filter a desired wavelength or combination of wavelengths without affecting the hue of the transmitted light. In some embodiments, a system and method can be provided to tune the color of light transmitted through an optical filter, such as the angle-insensitive SBS-based optical filter. More specifically, color-tuning of the transmitted light can be achieved by removing additional wavelengths from the transmitted spectrum.

It is well-known that any desired position in the CIE 1931 color space can be achieved by additive mixing of the three primary colors (i.e., red (R), green (G), and blue (B)) at an appropriate ratio, such as in electronic displays. On the other hand, it can also be shown that subtractive color mixing is possible. For example, a particular position in the CIE 1931 color space can also be achieved by filtering out an intelligently calculated ratio of the three primary colors, R, G, and B.

In some embodiments, to control the hue of an optical filter, in addition to the operation wavelengths (i.e., the wavelengths the filter is designed to block), additional wavelengths can also be blocked in order to achieve the desired hue. This process can be similar to adding an additional filter to an existing filter. To do so, one needs to carefully select the additional wavelength or wavelengths based on the desired hue and the stopping bands of the current filter.

Figure 8:
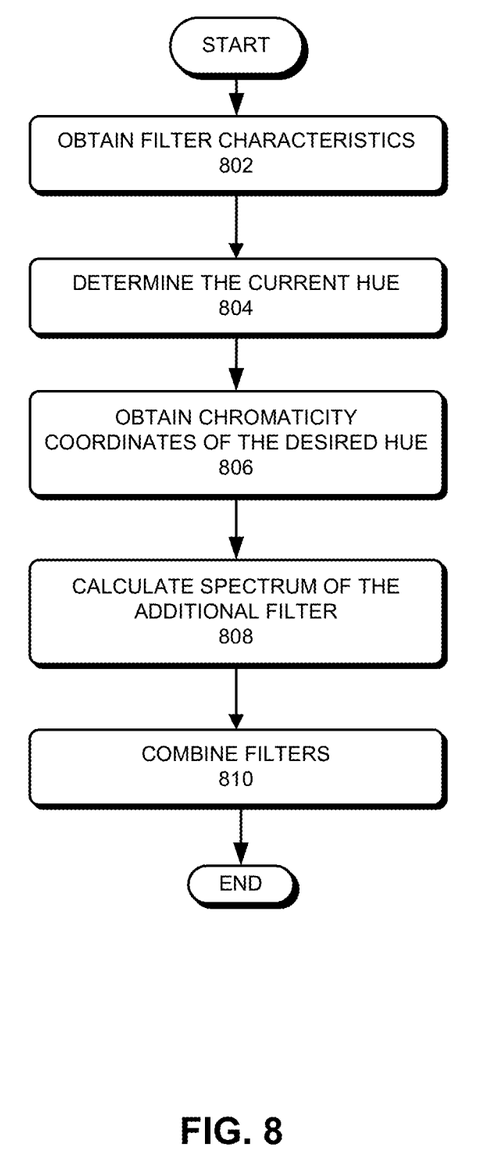
FIG. 8 presents a flowchart illustrating an exemplary process for providing hue control to an optical filter with one or more stopping bands, according to one embodiment.

FIG. 8 presents a flowchart illustrating an exemplary process for providing hue control to an optical filter with one or more stopping bands, according to one embodiment. During operation, the system obtains the filter characteristics of an optical filter (operation 802). For example, the system can obtain the center wavelength and FWHM of each stopping band of the optical filter. Alternatively, the system can obtain the transmittance or reflection spectrum of the optical filter. Based on the filter characteristics, the system can determine the hue of the optical filter (operation 804). Depending on the application, the hue can be the transmission hue or reflection hue. For aviation applications, the system obtains the transmission hue. More specifically, determining the hue of the filter can involve computing the chromaticity coordinates (e.g., either as RGB in the CIE 1931 RGB color space, or as XYZ in the CIE 1931 XYZ color space).

The system can also obtain the chromaticity coordinates of the desired hue (operation 806). Based on the chromaticity coordinates of the desired hue and the chromaticity coordinates of the hue of the optical filter, the system can calculate the transmittance or reflectance spectrum (e.g., wavelengths and FWHMs) of the additional filter (operation 808). In some embodiments, calculating the transmittance or reflectance spectrum of the additional filter can involve searching the CIE 1931 color space.

In some embodiments, the additional filter may have multiple (e.g., two) stopping bands. In further embodiments, one may determine a first stopping band of the additional filter, and then use the first stopping band as a constraint to calculate a second stopping band. The spectrum of the additional filter can be determined in such a way that the combined stopping bands of the original filter and the additional filter can result in the hue of the entire system being the desired hue. The system can then combine the additional optical filter with the original filter to achieve an optical filter having the desired hue (operation 810). Combining the filters can include generating a combined filter spectrum, and designing and fabricating an optical filter based on the combined filter spectrum. For example, if the optical filter is SBS-based, one may need to design Bragg-reflector stacks based on the various stopping bands in the combined filter spectrum. A particular Bragg-reflector structure can correspond to a particular stopping band.

Figure 9:
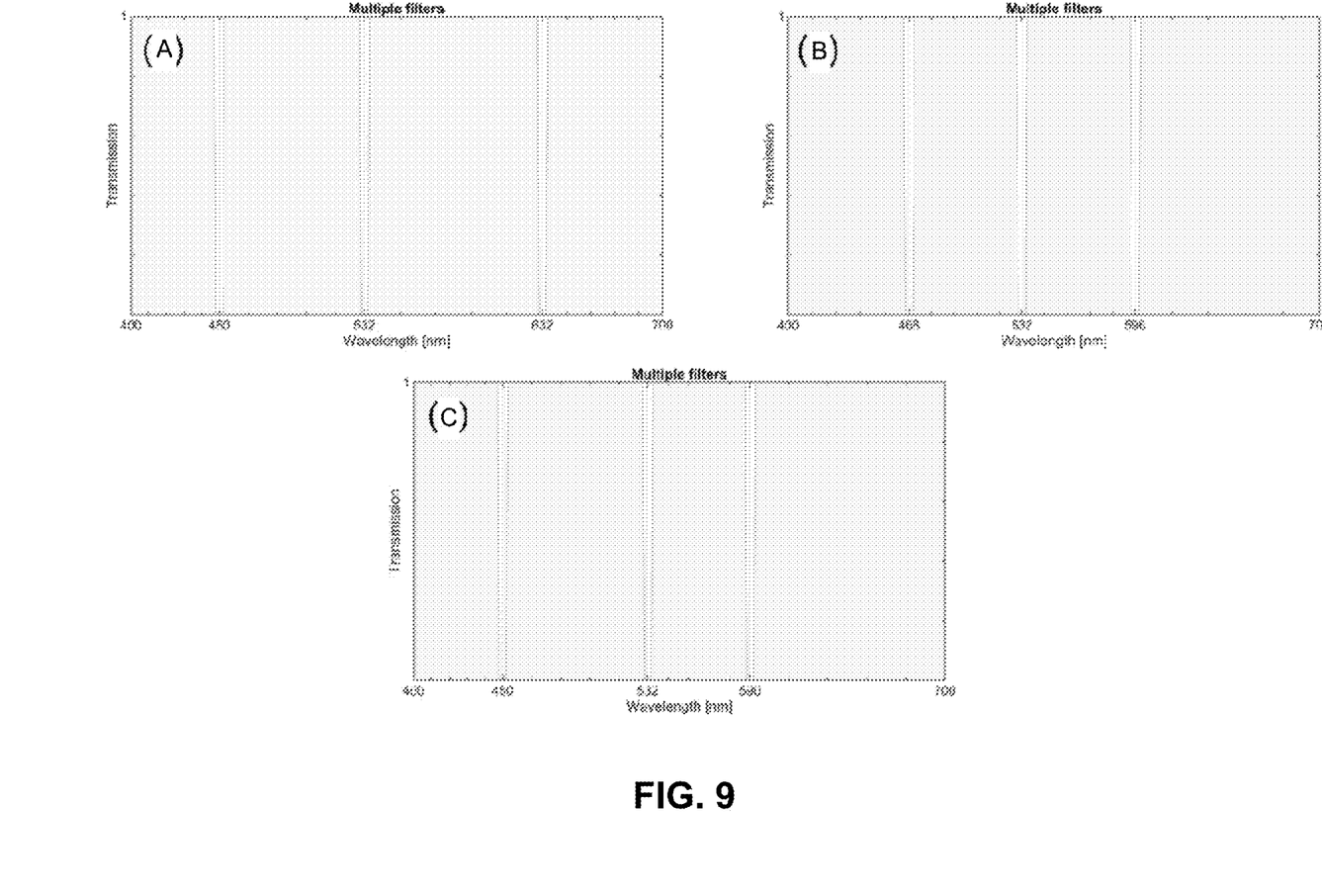
FIG. 9 illustrates the hue control effect achieved by combining multiple optical filters, according to one embodiment.

FIG. 9 illustrates the hue control effect achieved by combining multiple optical filters, according to one embodiment. In all scenarios, an optical filter that can block out the 532 nm light is needed. As previously shown in FIG. 7C, an optical filter that only blocks the 532 nm light can have a pinkish hue. To change the hue of the 532 nm optical filter to a more neutral color, one may need to add additional filters. Note that a neutral color can often be achieved by combining even amounts of complementary colors. In the case of an optical filter, colors are removed from the spectrum, and by carefully selecting which colors to remove, one can achieve the desired color appearance of the optical filter.

In FIG. 9A, in addition to the 532 nm stopping band, one can add additional filters that can block light at 450 nm and 632 nm wavelengths. Note that all these three wavelengths are accessible using commercial lasers, and thus this configuration can filter all the requisite wavelengths while ensuring hue neutrality. The background of FIG. 9A shows the transmission hue of the combined filter, which is a light gray. Similarly, in FIG. 9B, the combined filter can filter out, in addition to the 532 nm wavelength, 468 nm and 596 nm wavelengths, and the resultant hue of the combined filter (as shown by the background) can also be light gray, similar to the one shown in FIG. 9A. In FIG. 9C, the combined filter can filter out, in addition to the 532 nm wavelength, 450 nm and 590 nm wavelengths, and the resultant hue of the combined filter (as shown by the background) is similar to the ones shown in FIGS. 9A and 9B.

As one can see from FIG. 9, by choosing the appropriate combination of filters, an optical filter that can fulfill the desired filtering functions (e.g., filtering out the unwanted light) as well as having a well-controlled hue can be obtained. Such type of filters, especially when combined with an angle-insensitive design, can find a wide range of applications. For example, in addition to preventing laser-pointer-induced hazards, this novel optical filter can also be used for blocking ultraviolet (UV) light from entering the cockpit of an aircraft.

Rollable Optical Filter

Figure 10:
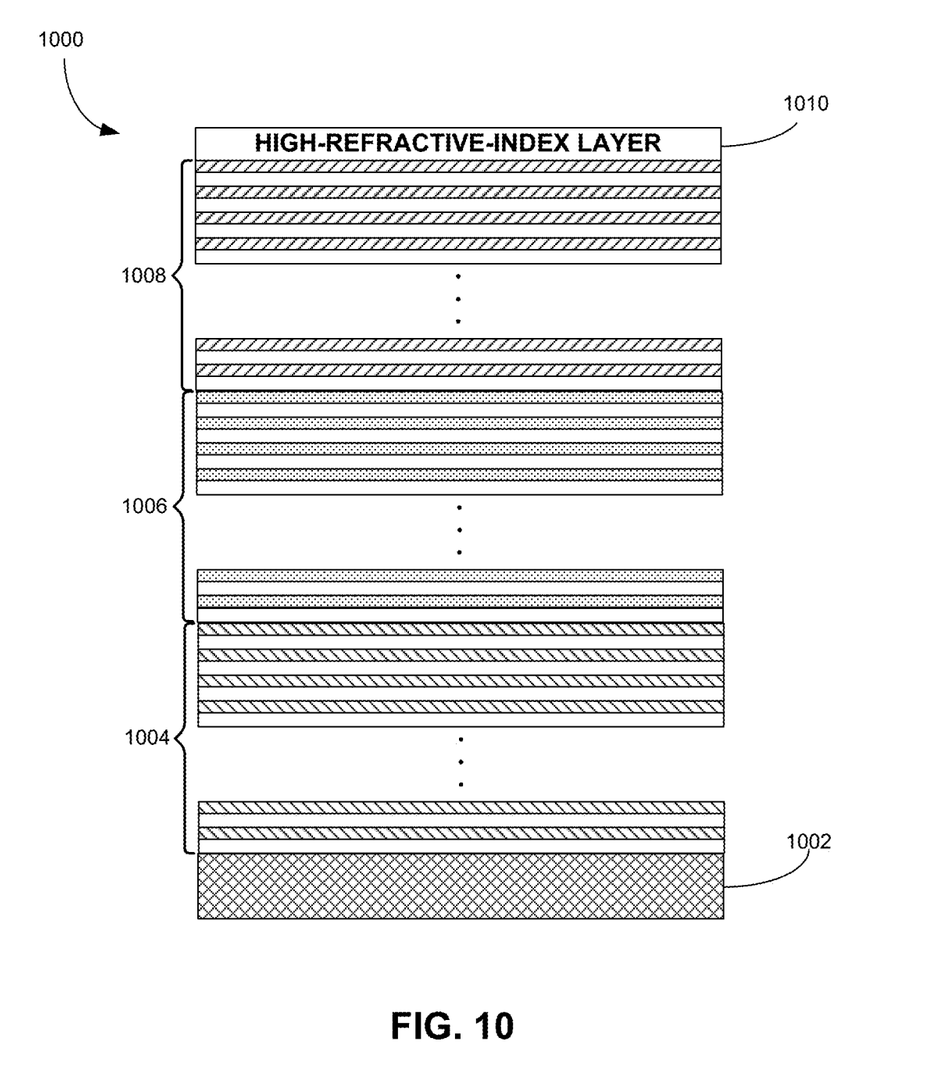
FIG. 10 shows an exemplary rollable, angle-insensitive optical filter with hue control, according to one embodiment.

In some embodiments, the novel optical filter can be in the form of a rollable film that can be applied onto a glass superstrate or substrate (e.g., the cockpit window of an aircraft). More specifically, the novel optical filter can be deposited onto a flexible, rollable substrate, such as polyethylene terephthalate (PET). FIG. 10 shows an exemplary rollable, angle-insensitive optical filter with hue control, according to one embodiment.

Rollable optical filter 1000 can include a flexible substrate 1002, a number of Bragg-reflector stacks (e.g., stacks 1004, 1006, and 1008), and a high-refractive-index layer 1010.

Flexible substrate 1002 can include a thin layer of PET, polyethylene naphthalate (PEN), or polyether ether ketone (PEEK). Although it is preferable for flexible substrate 1002 to be transparent and colorless, it is also possible for flexible substrate 1002 to have color. In such a scenario, when designing the filters to achieve a desired hue, one needs to take into consideration the color of flexible substrate 1002.

Bragg-reflector stacks 1004, 1006, and 1008 can include carefully designed Bragg reflectors, each being designed to block a certain wavelength. In some embodiments, at least one of the blocked wavelengths is selected for hue-control purposes. For example, to prevent laser-pointer hazards, Bragg-reflector stacks 1004 and 1006 have been designed in such a way that they can block the 450 nm (blue laser) and 532 nm (green laser) wavelengths. To reduce the color effect, Bragg-reflector stack 1008 can be designed to block an additional (e.g., 632 nm) wavelength. Assuming flexible substrate 1002 is clear, rollable optical filter 1000 can have a light gray (or off-white) color, similar to the color shown in FIG. 9A. In a different example, a filter that can block the 532 nm wavelength is needed, and Bragg-reflector stack 1004 can be designed to have a stopping band at 532 nm. For hue control, Bragg-reflector stacks 1006 and 1008 can be configured to block 468 nm and 596 nm wavelengths, respectively, and rollable optical filter 1000 can have a color similar to the one shown in FIG. 9C.

In some embodiments, Bragg-reflector stacks 1004-1008 (which can include dielectric materials) can be deposited, using a chemical vapor deposition (CVD) technique, on flexible substrate 1002. The thickness of each layer can be precisely controlled by controlling the deposition condition and time. Other material deposition techniques, such as atomic layer deposition or pulsed laser deposition, can also be possible.

High-refractive-index layer 1010 can provide angle-insensitivity. More specifically, rollable optical filter 1000 can have an angle-insensitive range of up to 75°. In some embodiments, high-refractive-index layer 1010 can have a refractive index of at least 2. In further embodiments, high-refractive-index layer 1010 can include $ZrO_2$ or $Ta_2O_5$. In some embodiments, high-refractive-index layer 1010 can be deposited on top of the Bragg-reflector stacks using a process that is similar to the process or processes used to form the Bragg layers. Because it can be the top-most layer, high-refractive-index layer 1010 can also act as a protective layer that protects the underlying Bragg layers from physical damage, such as scratches. The thickness of high-refractive-index layer 1010 can be between a few nm to a few hundred nm (e.g., between 1 nm and 200 nm). A thicker high-refractive-index layer 1010 can provide better surface protection, but may also result in a thicker film and a larger lateral shift of incident light. In applications where angle-insensitivity is not required, high-refractive-index layer 1010 can be optional.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A laminate film for optical filtering, comprising:
   a flexible substrate;
   one or more Bragg-reflector stacks positioned on the flexible substrate, wherein a respective Bragg-reflector stack has at least a first Bragg layer having a first refractive index and a second Bragg layer having a second refractive index, wherein the first refractive index is lower than the second refractive index, and wherein the Bragg-reflector stack is configured to have a stopping band with a predetermined center wavelength; and
   a high-refractive-index layer having a third refractive index of at least 2.0 positioned above the one or more Bragg-reflector stacks, wherein the high-refractive-index layer comprises an indium tin oxide (ITO) layer with a graded doping profile that is in direct contact with the first Bragg layer of a Bragg-reflector stack having the lower first refractive index, wherein the third refractive index is between the lower first refractive index and the higher second refractive index.

2. The laminate film of claim 1, wherein the flexible substrate comprises one or more of: polyethylene terephthalate (PET), polyethylene naphthalate (PEN), and polyether ether ketone (PEEK).

3. The laminate film of claim 1, wherein the one or more Bragg-reflector stacks comprise alternating $TiO_2$ and $HfO_2$ layers.

4. The laminate film of claim 1, wherein the high-refractive-index layer further comprises one or more of: $ZrO_2$ and $Ta_2O_5$.

5. The laminate film of claim 1, wherein a thickness of the high-refractive-index layer is between 1 and 200 nm.

6. The laminate film of claim 1, wherein at least one Bragg-reflector stack has a predetermined hue.

7. The laminate film of claim 6, wherein a stopping band of the at least one Bragg-reflector stack is determined based on stopping bands of other Bragg-reflector stacks and the predetermined hue.

8. The laminate film of claim 6, wherein the one or more Bragg-reflector stacks include at least three Bragg-reflector stacks, and wherein the Bragg-reflector stacks are configured such that the laminate film has a substantially neutral hue.

9. The laminate film of claim 1, wherein the predetermined center wavelength of the stopping band is approximately 532 nm or 450 nm.

10. The laminate film of claim 1, wherein the one or more Bragg-reflector stacks comprise a first Bragg-reflector stack having a stopping band with a center wavelength of approximately 450 nm, a second Bragg-reflector stack having a stopping band with a center wavelength of approximately 532 nm, and a third Bragg-reflector stack having a stopping band with a center wavelength of approximately 632 nm.

11. A method for fabricating a rollable optical filter, the method comprising:
   obtaining a flexible substrate;
   depositing, using a chemical vapor deposition (CVD) technique, one or more Bragg-reflector stacks on a surface of the flexible substrate, wherein depositing a respective Bragg-reflector stack comprises depositing a number of layers with alternating refractive indices, wherein a respective Bragg-reflector stack has at least a first Bragg layer having a first refractive index and a second Bragg layer having a second refractive index, wherein the first refractive index is lower than the second refractive index, and wherein the Bragg-reflector stack is configured to have a stopping band with a predetermined center wavelength; and
   depositing, using the CVD technique, a high-refractive-index layer having a third refractive index of at least 2.0 on the one or more Bragg-reflector stacks, wherein the high-refractive-index layer comprises an indium tin oxide (ITO) layer with a graded doping profile that is in direct contact with the first Bragg layer of a Bragg-reflector stack having the lower first refractive index, wherein the third refractive index is between the lower first refractive index and the higher second refractive index.

12. The method of claim 11, wherein the flexible substrate comprises one or more of: polyethylene terephthalate (PET), polyethylene naphthalate (PEN), and polyether ether ketone (PEEK).

13. The method of claim 11, wherein the one or more Bragg-reflector stacks comprise alternating $TiO_2$ and $HfO_2$ layers.

14. The method of claim 11, wherein the high-refractive-index layer further comprises one or more of: $ZrO_2$ and $Ta_2O_5$.

15. The method of claim 11, wherein a thickness of the high-refractive-index layer is between 1 and 200 nm.

16. The method of claim 11, further comprising designing at least one Bragg-reflector stack to have a predetermine hue.

17. The method of claim 16, wherein designing the at least one Bragg-reflector stack comprises determining a stopping band based on stopping bands of other Bragg-reflector stacks and chromaticity coordinates of the predetermined hue.

18. The method of claim 11, wherein depositing the one or more Bragg-reflector stacks comprises depositing at least three Bragg-reflector stacks, and wherein the one or more Bragg-reflector stacks are configured such that the rollable optical filter has a substantially neutral hue.

19. The method of claim 11, wherein the predetermined center wavelength of the stopping band is approximately 532 nm or 450 nm.

20. The method of claim 11, wherein the one or more Bragg-reflector stacks comprise a first Bragg-reflector stack having a stopping band with a center wavelength of approximately 450 nm, a second Bragg-reflector stack having a stopping band with a center wavelength of approximately 532 nm, and a third Bragg-reflector stack having a stopping band with a center wavelength of approximately 632 nm.

* * * * *